United States Patent
Nakamura

(10) Patent No.: US 11,171,658 B1
(45) Date of Patent: Nov. 9, 2021

(54) SEMICONDUCTOR INTEGRATED CIRCUIT, ELECTRONIC DEVICE, AND METHOD OF DETECTING FREQUENCY

(71) Applicant: Kioxia Corporation, Tokyo (JP)

(72) Inventor: Yutaka Nakamura, Kawasaki (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/178,427

(22) Filed: Feb. 18, 2021

(30) Foreign Application Priority Data

Sep. 23, 2020 (JP) .............................. JP2020-158934

(51) Int. Cl.
*H03L 7/099* (2006.01)
*H03L 7/18* (2006.01)
*H03L 7/093* (2006.01)
*H03L 7/089* (2006.01)

(52) U.S. Cl.
CPC ............ *H03L 7/099* (2013.01); *H03L 7/0891* (2013.01); *H03L 7/093* (2013.01); *H03L 7/18* (2013.01)

(58) Field of Classification Search
CPC ....... H03L 7/099; H03L 7/0891; H03L 7/093; H03L 7/18
USPC ......................................................... 327/156
See application file for complete search history.

(56) References Cited

U.S. PATENT DOCUMENTS

| | | | |
|---|---|---|---|
| 7,323,945 B2 | 1/2008 | Cyr et al. | |
| 7,436,227 B2 * | 10/2008 | Thomsen | H03L 1/022 327/147 |
| 7,816,959 B1 * | 10/2010 | Isik | H03L 7/18 327/156 |
| 8,089,318 B2 | 1/2012 | Yeung et al. | |
| 8,575,981 B1 * | 11/2013 | Chen | H03L 1/022 327/156 |
| 8,604,848 B1 * | 12/2013 | Chen | H03L 7/1974 327/156 |
| 10,218,363 B1 * | 2/2019 | Kavousian | G06F 1/32 |
| 10,291,389 B1 * | 5/2019 | Midha | H03C 3/0925 |
| 10,911,055 B1 * | 2/2021 | Bahr | H03L 1/022 |
| 2008/0007365 A1 | 1/2008 | Venuti et al. | |
| 2008/0042766 A1 * | 2/2008 | Tarng | H03B 5/04 331/167 |

(Continued)

FOREIGN PATENT DOCUMENTS

JP 2008-206084 A 9/2008

*Primary Examiner* — Adam D Houston
(74) *Attorney, Agent, or Firm* — Oblon, McClelland, Maier & Neustadt, L.L.P.

(57) ABSTRACT

A semiconductor integrated circuit includes: a node to receive a reference clock signal; a voltage-controlled oscillation circuit to generate a clock signal based on a code corresponding to a frequency of the reference clock signal received by the node and on a control voltage; a calibration circuit to generate the code based on the frequency of the reference clock signal and on a frequency of the clock signal, and supply the generated code to the voltage-controlled oscillation circuit; and a phase locked loop circuit to generate the control voltage based on a phase difference of the clock signal with respect to the reference clock signal, and supply the generated control voltage to the voltage-controlled oscillation circuit. The voltage-controlled oscillation circuit is capable of changing the frequency of the clock signal based on the code supplied from the calibration circuit and on the control voltage supplied from the phase locked loop circuit.

18 Claims, 3 Drawing Sheets

(56) References Cited

U.S. PATENT DOCUMENTS

| | | | |
|---|---|---|---|
| 2008/0157881 A1* | 7/2008 | Dent | H03L 7/093 331/18 |
| 2009/0128201 A1* | 5/2009 | Chen | H03L 7/081 327/149 |
| 2010/0098203 A1* | 4/2010 | Chien | H03L 7/089 375/371 |
| 2012/0044000 A1* | 2/2012 | Hsieh | H03L 7/1974 327/156 |
| 2013/0257547 A1* | 10/2013 | Arai | H03L 7/099 331/18 |
| 2013/0321048 A1* | 12/2013 | He | G01S 19/37 327/156 |
| 2014/0140444 A1* | 5/2014 | Onishi | H03L 7/104 375/320 |
| 2015/0180486 A1* | 6/2015 | Shanan | H03L 7/099 327/156 |
| 2015/0263741 A1* | 9/2015 | Li | H03L 7/099 327/156 |
| 2016/0036453 A1* | 2/2016 | Frank | H03L 7/085 327/156 |
| 2016/0285465 A1* | 9/2016 | Abe | H03B 5/1278 |
| 2017/0155393 A1* | 6/2017 | Hattori | H03B 5/32 |
| 2017/0214408 A1* | 7/2017 | Liang | H03M 1/1009 |
| 2017/0310326 A1* | 10/2017 | Nakajima | H03L 7/095 |
| 2018/0191358 A1* | 7/2018 | Wang | H03L 7/087 |
| 2018/0342980 A1* | 11/2018 | Esterline | G01R 23/00 |
| 2019/0212703 A1* | 7/2019 | Yao | H03L 7/099 |
| 2020/0366241 A1* | 11/2020 | Tsuji | H03B 5/24 |

\* cited by examiner

FIG.3
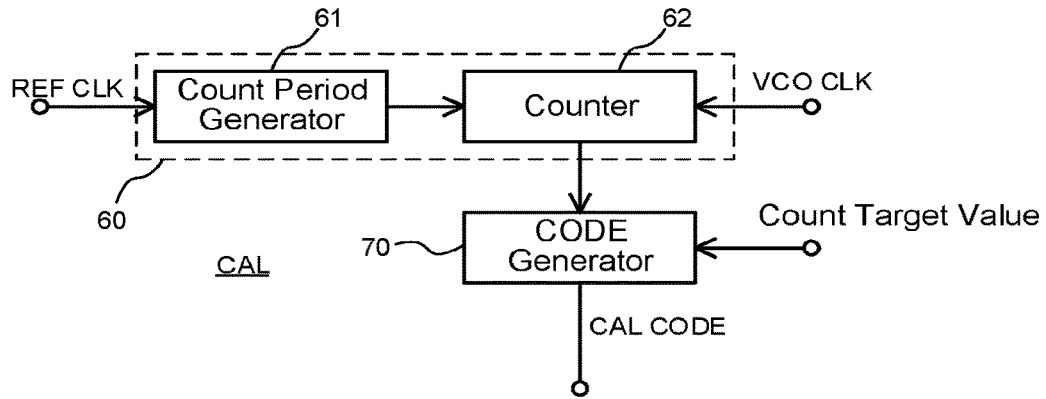
FIG.4
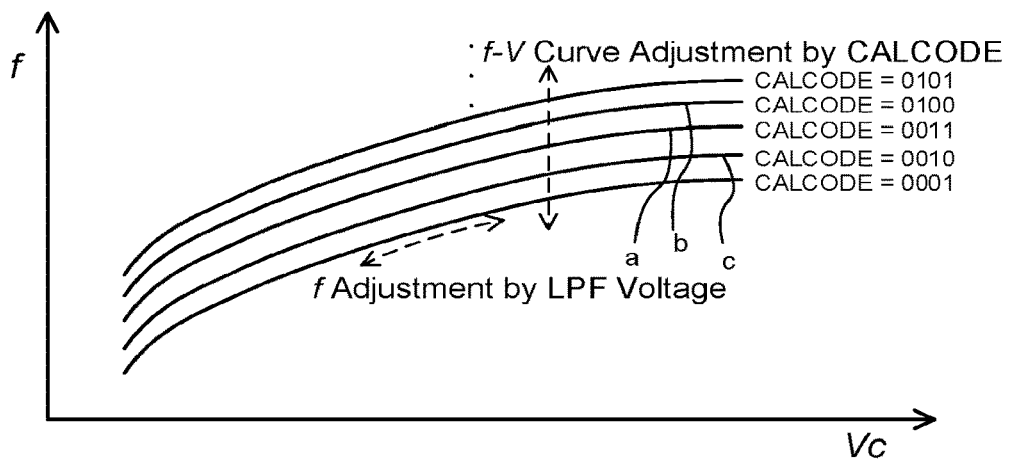
FIG.5
| Frequency | Period | Code |
|---|---|---|
| 19.2 MHz | 52.08 ns | 0001 |
| 26.0 MHz | 38.46 ns | 0100 |
| 38.4 MHz | 26.04 ns | 1000 |
| 52.0 MHz | 19.23 ns | 1100 |

SEMICONDUCTOR INTEGRATED CIRCUIT, ELECTRONIC DEVICE, AND METHOD OF DETECTING FREQUENCY

CROSSREFERENCE TO RELATED APPLICATIONS

This application is based upon and claims the benefit of priority from Japanese Patent Application No. 2020-158934, filed on Sep. 23, 2020; the entire contents of which are incorporated herein by reference.

FIELD

Embodiments described herein relate generally to a semiconductor integrated circuit, an electronic device, and a method of detecting frequency.

BACKGROUND

An electronic device uses a clock signal in order to synchronize operations of circuits therein. Generally, the clock signal is generated using a reference clock signal (Reference Clock) as a reference. The reference clock is standardized and, for example, 19.2 MHz, 26 MHz, 38.4 MHz, 52 MHz are known.

In a form in which the electronic device is connected to a host device, the electronic device can receive the reference clock signal from the host device. The electronic device that received the reference clock signal can generate the clock signal to be used in the electronic device using the received reference clock signal as the reference. Here, when the electronic device is connected to an unknown host device, a frequency of the reference clock is unknown, thus possibly causing a problem in generation of the clock signal by the electronic device.

BRIEF DESCRIPTION OF THE DRAWINGS

FIG. 3 is a block diagram illustrating a configuration of a calibration circuit in the semiconductor integrated circuit according to the first embodiment.

FIG. 4 is a diagram for explaining adjustment of a base oscillation frequency of VCO in the semiconductor integrated circuit according to the first embodiment.

FIG. 5 is a diagram illustrating an example of a calibration code in the semiconductor integrated circuit according to the first embodiment.

DETAILED DESCRIPTION

In the conventional electronic device, when the frequency of the reference clock is unknown, there is a possibility of causing a problem in generation of the clock signal. Embodiments disclosed below have been made to solve the problem and make it possible to provide a semiconductor integrated circuit, an electronic device, and a frequency detection method capable of easily detecting the frequency of the reference clock without increasing the circuit scale.

A semiconductor integrated circuit in an embodiment includes a node configured to receive a reference clock signal, and a voltage-controlled oscillation circuit configured to generate a clock signal based on a code corresponding to a frequency of the reference clock signal received by the node and on a control voltage. The semiconductor integrated circuit in the embodiment further includes a calibration circuit configured to generate the code based on the frequency of the reference clock signal and on a frequency of the clock signal, and supply the generated code to the voltage-controlled oscillation circuit, and a phase locked loop circuit configured to generate the control voltage based on a phase difference of the clock signal with respect to the reference clock signal, and supply the generated control voltage to the voltage-controlled oscillation circuit. The voltage-controlled oscillation circuit in the embodiment is able to change the frequency of the clock signal based on the code supplied from the calibration circuit and on the control voltage supplied from the phase locked loop circuit.

(Electronic Device of Embodiments)

Figure 1:
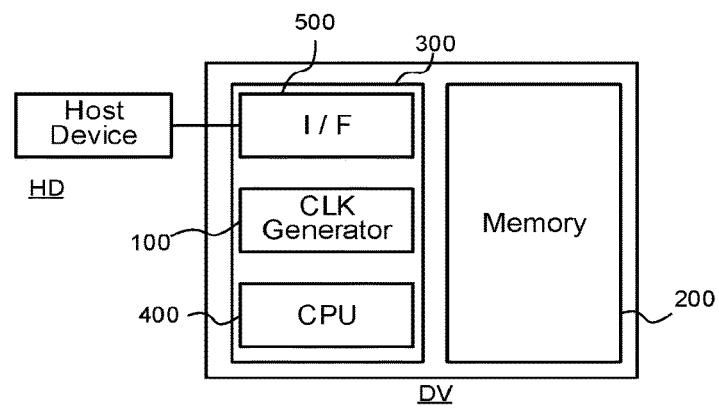
FIG. 1 is a block diagram illustrating a configuration of an electronic device according to a first embodiment.

Hereinafter, embodiments will be explained in detail referring to the drawings. As illustrated in FIG. 1, an electronic device DV in the embodiments includes a memory 200 and a controller 300. The controller 300 includes a clock generator 100, a CPU 400, and an interface circuit 500. The electronic device DV can be connected to a host device HD.

The clock generator 100 is an oscillation circuit which supplies a clock signal to each circuitry (for example, the interface circuit 500) constituting the electronic device DV. The clock generator 100 receives a reference clock signal from an external part of the electronic device DV, such as the host device HD, and generates various clock signals to be used by the electronic device DV, using the reference clock signal as a reference. The clock signal is not limited to a signal of a single frequency, but a plurality of signals of a plurality of different frequencies may be generated. The memory 200 is, for example, a storage medium which can store information in a nonvolatile manner. The memory 200 is realized, for example, by a NAND flash memory. The memory 200 stores, for example, user data transmitted from the host device HD, management information on the electronic device DV, system data, log data on the host device HD or the electronic device DV, and so on.

The controller 300 is an arithmetic block which writes data into the memory 200 or reads data from the memory 200 according to a command from the host device HD or the like. The central processing unit (CPU) 400 is an arithmetic block which executes a program or firmware read from a storage device such as a not-illustrated ROM or the like to thereby conduct various controls. The interface (I/F) circuit 500 is an interface circuit for connecting the electronic device DV to the host device HD.

The clock generator 100 generates a clock signal synchronized with a reference signal of the host device HD. Therefore, the clock generator 100 can receive the reference clock signal from the host device HD. Here, in a case where the electronic device DV is configured to be connectable to an unknown host device HD, the frequency of the reference clock signal received from the host device HD is unknown. Hence, the clock generator 100 has a function of detecting the frequency of the reference clock signal received from the host device HD.

(Configuration of the Clock Generator 100 in the Embodiment)

Figure 2:
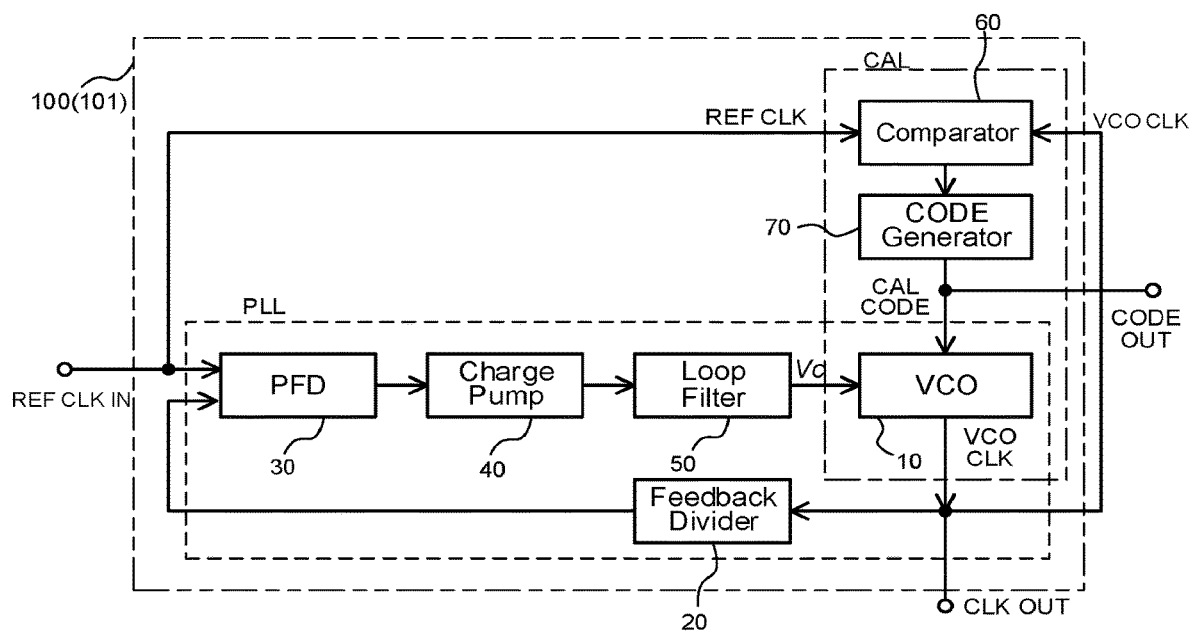
FIG. 2 is a block diagram illustrating a configuration of a clock generator (semiconductor integrated circuit) according to the first embodiment.

Subsequently, a configuration of the clock generator 100 according to a first embodiment will be explained referring to FIG. 2. As illustrated in FIG. 2, the clock generator 100 in this embodiment includes a phase locked loop circuit PLL which receives a reference clock signal REFCLK and generates a clock signal CLK, and a calibration circuit CAL. The clock generator 100 in the embodiment also has a function as a frequency detector. The reference clock signal REFCLK is input from an external part of the clock generator 100 via a node REFCLKIN.

The phase locked loop circuit PLL is an oscillation circuit block which generates the clock signal CLK using the reference clock signal REFCLK as a reference. The phase locked loop circuit PLL includes a voltage-controlled oscillator (VCO) 10, a feedback divider 20, a phase frequency detector 30, a charge pump 40, and a loop filter 50.

The voltage-controlled oscillator 10 is an oscillator circuitry which can control an oscillation frequency based on a given control voltage Vc. The voltage-controlled oscillator 10 generates a clock signal CLK (VCOCLK) controlled in oscillation frequency. The generated clock signal CLK is output from a node CLKOUT to an external part of the clock generator 100. Further, the voltage-controlled oscillator 10 in this embodiment can change a relation (characteristic) between the control voltage Vc and an oscillation frequency f by receiving a calibration code CALCODE and changing a base oscillation frequency. The feedback divider 20 is a divider circuitry which divides the clock signal CLK generated by the voltage-controlled oscillator 10 at a particular frequency division ratio and feeds the resultant back to the phase frequency detector 30.

The phase frequency detector 30 is a circuit which compares phases of the reference clock signal REFCLK and an output signal of the feedback divider 20. The phase frequency detector 30 converts a phase difference between the reference clock signal REFCLK and the output signal of the feedback divider 20 into a voltage value. The charge pump 40 is an amplifier circuitry which amplifies a voltage output from the phase frequency detector 30. The loop filter 50 is a feedback loop filter circuitry of the phase locked loop circuit PLL and functions as a low-pass filter which filters an output voltage of the charge pump 40. An output voltage of the loop filter 50 becomes the control voltage Vc for the voltage-controlled oscillator 10.

As explained above, the phase locked loop circuit PLL forms a control loop of a PLL oscillator which compares the phases of the clock signal CLK generated by the voltage-controlled oscillator 10 and the reference clock signal REFCLK.

The calibration circuit CAL is a circuit block which adjusts a base oscillation frequency of the voltage-controlled oscillator 10 of the phase locked loop circuit PLL. The calibration circuit CAL includes a comparator 60, a code generator 70, and the voltage-controlled oscillator 10. The comparator 60 is a circuit block which compares frequencies of the reference clock signal REFCLK and the clock signal CLK generated by the voltage-controlled oscillator 10. The code generator 70 is a circuit clock which increases/decreases a digital code based on a comparison result of the comparator 60 and outputs the resulting digital code as the calibration code CALCODE. The voltage-controlled oscillator 10 generates a clock signal CLK based on the frequency according to the calibration code CALCODE generated by the code generator 70. An adjustment of the oscillation frequency by the calibration code CALCODE is performed, for example, when a frequency range controllable by using the control voltage Vc is exceeded such as 19.2 MHz, 26 MHz, 38.4 MHz, 52 MHz.

Here, a configuration example of the comparator 60 of the calibration circuit CAL will be explained in detail referring to FIG. 3. As illustrated in FIG. 3, the comparator 60 includes a count period generator 61 and a counter 62. The count period generator 61 is a circuit block which generates a timing signal at a certain time interval using the reference clock signal REFCLK as a reference. The timing signal is a signal generated at a time interval corresponding to a particular number of pulses of the reference clock signal REFCLK. The counter 62 counts, as a count value, the number of pulses of the clock signal CLK from the voltage-controlled oscillator 10 which is input during a period of the timing signal obtained from the count period generator 61. For example, when the timing signal corresponds to 10 pulses of the reference clock signal REFCLK, the counter 62 counts the number of pulses of the clock signal CLK received during the period. By comparing them, the counter 62 can determine which of the frequencies of the reference clock signal REFCLK and the clock signal CLK is higher.

The code generator 70 generates the calibration code CALCODE which controls the base oscillation frequency of the voltage-controlled oscillator 10 based on the count value from the counter 62. Here, the count value of the counter 62 is the comparison result of the comparator 60. For example, when the count value received from the counter 62 is less than a threshold value, the code generator 70 adds 1 to the calibration code CALCODE, whereas when the count value received from the counter 62 is more than the threshold value, the code generator 70 subtracts 1 from the calibration code CALCODE. The voltage-controlled oscillator 10 changes the base oscillation frequency according to the received calibration code CALCODE.

The control loop for roughly adjusting the base frequency of the voltage-controlled oscillator 10 via the calibration code CALCODE is constituted as explained above.

(Operation of the Clock Generator 100 in the Embodiment)

In the clock generator 100 in the embodiment, the calibration circuit CAL and the phase locked loop circuit PLL individually operate. The calibration circuit CAL adjusts the base frequency of the clock signal CLK generated by the clock generator 100. Besides, the phase locked loop circuit PLL locks the frequency of the clock signal based on the base frequency adjusted by an operation of the calibration circuit CAL. Hereinafter, an operation of the clock generator 100 will be explained referring to FIG. 2 to FIG. 4.

The calibration circuit CAL operates when a reference clock signal REFCLK of a new frequency or an unknown frequency is supplied, such as when the electronic device DV is connected to the host device HD or the like. When the reference clock signal REFCLK is supplied, the count period generator 61 of the comparator 60 generates the timing signal specifying the count period based on the frequency of the reference clock signal REFCLK. The counter 62 counts the number of pulses of the clock signal generated by the voltage-controlled oscillator 10 during the timing signal generated by the count period generator 61.

The code generator 70 generates the calibration code CALCODE made by adding a certain number (for example, "1") when the count value during the count period counted by the counter 62 is less than the threshold value. The count value during the count period being less than the threshold value means that the frequency of the clock signal CLK is lower than the frequency of the reference clock signal REFCLK. Besides, the code generator 70 generates the calibration code CALCODE made by subtracting a certain number (for example, "1") when the count value by the counter 62 is more than the threshold value. The count value during the count period being more than the threshold value means that the frequency of the clock signal CLK is higher than the frequency of the reference clock signal REFCLK.

In FIG. 4, the horizontal axis indicates the control voltage Vc, and the vertical axis indicates the frequency of the clock signal CLK. FIG. 4 illustrates that a range of the frequency of the clock signal CLK with respect to the same range of the control voltage Vc is different for each calibration code CALCODE. For example, as illustrated in FIG. 4, it is assumed that the current calibration code CALCODE is "0011", and when the count value of the counter 62 is less than the threshold value (when the frequency of the clock signal CLK is lower than the frequency of the reference clock signal REFCLK), the code generator 70 makes the calibration code CALCODE into "0100" by adding just "1". As a result of this, an oscillation characteristic of the voltage-controlled oscillator 10 changes from "a" to "b" in FIG. 4, so that the oscillation frequency of the clock signal CLK with respect to the control voltage Vc shifts to high as a whole. As a result of this, when the count value of the counter 62 substantially coincides with the threshold value (when the frequency of the reference clock signal REFCLK substantially coincides with the frequency of the clock signal CLK), the calibration code CALCODE is fixed to "0100", so that the voltage-controlled oscillator 10 generates the clock signal CLK by the characteristics of "b" in FIG. 4.

Further, as illustrated in FIG. 4, it is assumed that the current calibration code CALCODE is "0011", and when the count value of the counter 62 is more than the threshold value (when the frequency of the clock signal CLK is higher than the frequency of the reference clock signal REFCLK), the code generator 70 makes the calibration code CALCODE into "0010" by subtracting just "1". As a result of this, the oscillation characteristic of the voltage-controlled oscillator 10 changes from "a" to "c" in FIG. 4, so that the frequency of the clock signal CLK with respect to the control voltage Vc shifts to low as a whole. As a result of this, when the count value of the counter 62 coincides with the threshold value (when the frequency of the reference clock signal REFCLK substantially coincides with the frequency of the clock signal CLK), the calibration code CALCODE is fixed to "0010", so that the voltage-controlled oscillator 10 generates the clock signal CLK by the characteristics of "c" in FIG. 4.

The frequency of the reference clock signal REFCLK is standardized and, for example, a plurality of frequencies such as 19.2 MHz, 26 MHz, 38.4 MHz, 52 MHz are used. In this event, it is assumed that the calibration code CALCODE is associated with the frequency or the period of each reference clock signal REFCLK as illustrated in FIG. 5. In this case, when the electronic device DV is connected to the host device HD and the reference clock signal REFCLK is supplied from the host device HD, a corresponding calibration code CALCODE is quickly decided. The voltage-controlled oscillator 10 of the electronic device DV becomes possible to generate the clock signal CLK based on the corresponding frequency. Note that in a corresponding table illustrated in FIG. 5, the frequency of the reference clock signal REFCLK (Frequency), the period corresponding to the frequency (Period), and the calibration code CALCODE (Code) are associated with one another. The period of the reference clock signal REFCLK can be referred to, for example, when the count period generator 61 generates a particular timing signal.

A table of the reference clock signal REFCLK and the calibration code CALCODE illustrated in FIG. 5 can be created, for example, as follows. More specifically, the control voltage Vc is fixed to a certain voltage value (for example, a middle value of a variable range of Vc in FIG. 4) and then the calibration code CALCODE is set to a certain value (for example, "0100"). When the reference clock signal REFCLK is, for example, 19.2 MHz (period of 52.08 ns), the interval of the timing signal by the count period generator 61 becomes 52.08 ns and, the calibration code CALCODE capable of outputting the clock signal CLK capable counting, for example, 100 times during this time is regarded as, for example, "0001". Next, when the reference clock signal REFCLK is, for example, 38.4 MHz (period of 26.04 ns), the interval of the timing signal by the count period generator 61 becomes 26.04 ns, and the calibration code CALCODE capable of outputting the clock signal CLK capable counting, for example, 100 times during this time is regarded as, for example, "1000". This is a direction in which the frequency is increased in the vertical axis (frequency) direction in FIG. 4. This operation is repeated correspondingly to the number of frequency candidates of the reference clock signal REFCLK, and stored in the memory 200 or the like, thereby completing the table.

In other words, the calibration circuit CAL has a function of adjusting the base oscillation frequency of the voltage-controlled oscillator 10, in other words, the oscillation characteristic (Vc–f characteristic). Thus, even in a situation where the frequency of the reference clock signal REFCLK is changed every time, the frequency lock by the phase locked loop circuit PLL can quickly operate. In other words, the clock generator 100 can quickly generate the synchronized clock signal CLK. The calibration circuit CAL locks the calibration code CALCODE at a stage preceding the activation of the phase locked loop circuit PLL in terms of the function.

The operation of the phase locked loop circuit PLL synchronizes the clock signal CLK generated by the voltage-controlled oscillator 10 with the reference clock signal REFCLK. The clock signal CLK generated by the voltage-controlled oscillator 10 is input into the feedback divider 20. The feedback divider 20 divides the clock signal CLK at a particular frequency division ratio, and sends the resultant as the output signal to the phase frequency detector 30. The phase frequency detector 30 compares the phases of the given reference clock signal REFCLK and the output signal of the feedback divider 20, converts the phase difference into a voltage value, and sends the converted signal to the charge pump 40. The charge pump 40 amplifies the received signal and sends the amplified signal to the voltage-controlled oscillator 10 via the loop filter 50. The voltage-controlled oscillator 10 generates the clock signal CLK controlled in frequency using the output voltage of the loop filter 50 as the control voltage Vc. With such a phase synchronization loop, the voltage-controlled oscillator 10 can generate the stable clock signal CLK synchronized with the reference clock signal REFCLK.

As explained above, the clock generator 100 in the embodiment is made by combining the loop of the calibration circuit which locks the base frequency of the reference clock signal REFCLK and the loop of the phase locked loop circuit which generates the clock signal CLK locked to the reference clock signal REFCLK in the base frequency.

(Frequency Detection Operation of a Frequency Detector 101 Using the Configuration of the Clock Generator 100)

Incidentally, when the electronic device DV is connected to the host device HD which supplies an unknown reference clock signal REFCLK, the frequency of the reference clock signal REFCLK is unknown at the stage where the electronic device DV is connected to the host device HD. When a signal of an unknown frequency is given, the clock generator 100 in the embodiment operated also as a frequency detector 101 which detects the frequency.

As explained above, the clock generator 100 in the embodiment performs locking of the calibration code CALCODE according to the reference clock signal REFCLK by the calibration circuit CAL, and performs PLL-locking synchronized with the reference clock signal REFCLK by the phase locked loop circuit PLL. Hence, the clock generator 100 in the embodiment stores, in advance in the memory 200 or the like, the combination of the reference clock signal REFCLK of the synchronizable frequency and the calibration code CALCODE locked when the reference clock signal REFCLK is given. This is manageable as a table as illustrated, for example, in FIG. 5.

When the unknown reference clock signal REFCLK is given to the clock generator 100, the calibration code CALCODE corresponding to the frequency of the given reference clock signal REFCLK is locked by the control loop of the calibration circuit CAL. Where the calibration code CALCODE is locked, the calibration code CALCODE is output from a code output node CODEOUT. In other words, once the calibration code CALCODE is specified, the corresponding frequency can be specified based on the table illustrated in FIG. 5, so that when the reference clock signal REFCLK of the unknown frequency is given, the controller 300 can specify the frequency. This is the operation as the frequency detector 101. Note that the initial value of the calibration code CALCODE in the control loop of the calibration circuit CAL only needs to be near a middle between the supposed upper limit and lower limit. In the example illustrated in FIG. 5, the initial value may be either 26.0 MHz or 38.4 MHz near the middle of four calibration codes CALCODE.

Note that when the calibration code CALCODE is locked, the voltage-controlled oscillator 10 generates the clock signal CLK synchronized with the reference clock signal REFCLK by the control loop of the phase locked loop circuit PLL. This is the operation as the clock generator 100.

As explained above, the clock generator 100 (frequency detector 101) in the embodiment can obtain the calibration code CALCODE of the reference clock signal REFCLK of the frequency locked by the calibration circuit CAL before the PLL locking by the phase locked loop circuit PLL. Accordingly, the clock generator 100 (frequency detector 101) in the embodiment can extremely speedily detect the frequency of the reference clock signal REFCLK. In other words, according to the first embodiment, the frequency of the given clock signal CLK can be speedily detected.

Second Embodiment

Figure 6:
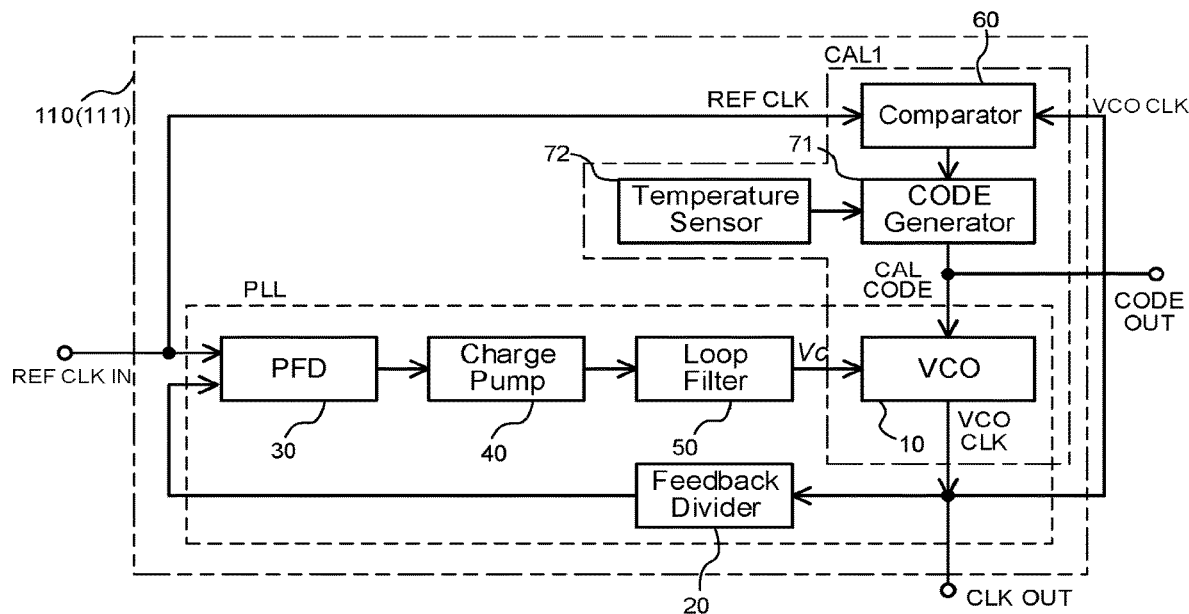
FIG. 6 is a block diagram illustrating a configuration of a semiconductor integrated circuit according to a second embodiment.

Subsequently, a clock generator 110 (frequency detector 111) in a second embodiment will be explained in detail referring to FIG. 6. The clock generator 110 in this embodiment is made by changing the configuration of a part of the calibration circuit CAL of the clock generator 100 in the first embodiment into a calibration circuit CAL'. In the following explanation, common codes are given to components common to the first embodiment to omit a duplicated explanation. As illustrated in FIG. 6, the clock generator 110 in this embodiment includes a code generator 71 in place of the code generator 70 in the first embodiment, and further includes a temperature sensor 72. The temperature sensor 72 can be realized by using, for example, an element changing in resistance value according to temperature.

The code generator 71 is a circuit block which increases/decreases the digital code based on the comparison result of the comparator 60 and outputs the resultant as the calibration code CALCODE. The temperature sensor 72 measures an ambient temperature and sends the measured data to the code generator 71. The code generator 71 has a function of correcting the calibration code CALCODE generated based on a temperature measured value in addition to the function of the code generator 70.

For example, an example, in which the voltage-controlled oscillator 10 has such temperature characteristics that the oscillation frequency shifts to high with respect to a certain control voltage Vc in proportion to a temperature increase, will be explained. In the case where the measured data received from the temperature sensor 72 shows a rising trend, the code generator 71 decreases the addition width of the calibration code CALCODE (for example, decreases to"1" when the addition amount during normal time is "2"), or increases the subtraction value (for example, increases to"2" when the decrease amount during normal time is "1"). In other words, the increase width of increasing the base frequency of the voltage-controlled oscillator 10 is decreased, or the decrease width of the same is increased. As a result of this, the base frequency of the voltage-controlled oscillator 10 becomes less likely to increase but becomes more likely to decrease.

Generally, the calibration circuit CAL operates when the reference clock signal REFCLK is supplied or when its frequency is changed. However, even without change in the reference clock signal REFCLK, the calibration circuit CAL of the clock generator 110 is operated to increase its operation frequency, thereby making it possible to level the temperature characteristics of the voltage-controlled oscillator 10. This effect can be provided also in the case where the clock generator 110 operates as the frequency detector 111. In other words, the temperature characteristics as the frequency detector can be leveled.

Third Embodiment

Subsequently, a clock generator 120 (frequency detector 121) in a third embodiment will be explained in detail referring to FIG. 7. The clock generator 120 in this embodiment is made by changing the configuration of a part of the calibration circuit CAL of the clock generator 100 in the first embodiment into a calibration circuit CAL2. In the following explanation, common codes are given to components common to the first embodiment to omit a duplicated explanation.

Figure 7:
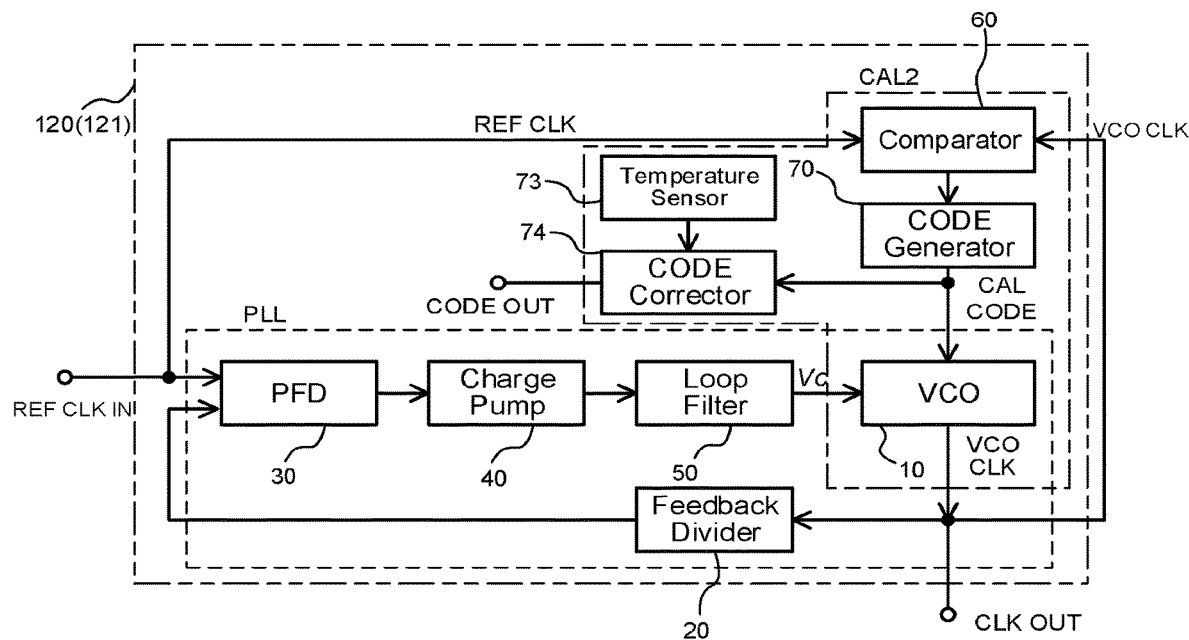
FIG. 7 is a block diagram illustrating a configuration of a semiconductor integrated circuit according to a third embodiment.

As illustrated in FIG. 7, the clock generator 120 in this embodiment further includes a temperature sensor 73 and a code corrector 74 in addition to the configuration of the first embodiment. The temperature sensor 73 measures an ambient temperature and generates measured data. The code corrector 74 is an arithmetic unit which corrects the calibration code CALCODE.

In the clock generator 120 in this embodiment, the calibration code CALCODE generated by the code generator 70 is data that is not temperature compensated. Hence, the code corrector 74 directly corrects the calibration code CAL-CODE based on the measured data received from the temperature sensor 73.

For example, an example in which the voltage-controlled oscillator 10 has such temperature characteristics that the oscillation frequency shifts to high with respect to a certain control voltage Vc in proportion to a temperature increase, will be explained. In this case, even with the same calibration code CALCODE, the voltage-controlled oscillator 10 generates a clock signal of a high frequency. Hence, the code corrector 74 performs an operation of subtracting a particular value from the value of the calibration code CALCODE if the measured data received from the temperature sensor 73 shows a temperature increase.

In the clock generator 120 in this embodiment, the temperature compensation of the frequency of the calibration code CALCODE to be generated is not performed. However, in the case where the clock generator 120 operates as the frequency detector 121, a temperature-compensated calibration code CALCODE can be obtained. In other words, the temperature-compensated frequency can be detected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a node configured to receive a reference clock signal;
   a voltage-controlled oscillation circuit configured to generate a clock signal based on a code corresponding to a frequency of the reference clock signal received by the node and on a control voltage;
   a calibration circuit configured to generate the code based on the frequency of the reference clock signal and on a frequency of the clock signal, and supply the generated code to the voltage-controlled oscillation circuit; and
   a phase locked loop circuit configured to generate the control voltage based on a phase difference of the clock signal with respect to the reference clock signal, and supply the generated control voltage to the voltage-controlled oscillation circuit, wherein
   the voltage-controlled oscillation circuit is capable of changing the frequency of the clock signal based on the code supplied from the calibration circuit and on the control voltage supplied from the phase locked loop circuit.

2. The semiconductor integrated circuit according to claim 1, wherein
   the calibration circuit comprises:
   a comparator configured to compare the reference clock signal and the clock signal; and
   a code generator configured to generate the code based on a comparison result of the comparator.

3. The semiconductor integrated circuit according to claim 2, wherein
   the comparator comprises:
   a first circuit configured to generate a timing signal relating to a period according to the number of pulses of the reference clock signal; and
   a second circuit configured to count the number of pulses of the clock signal based on the generated timing signal, wherein
   the second circuit is configured to supply the comparison result based on the counted number of pulses to the code generator.

4. The semiconductor integrated circuit according to claim 1, further comprising
   a temperature sensor, wherein
   the calibration circuit is configured to generate the code based on a detection result of the temperature sensor.

5. The semiconductor integrated circuit according to claim 1, further comprising:
   a temperature sensor; and
   a correction circuit configured to correct the code based on a detection result of the temperature sensor.

6. The semiconductor integrated circuit according to claim 1, wherein
   the calibration circuit is configured to supply any one of a plurality of the codes corresponding to a plurality of frequency candidates of the reference clock to the voltage-controlled oscillation circuit.

7. An electronic device comprising:
   the semiconductor integrated circuit according to claim 1; and
   a circuit configured to receive the clock signal from the semiconductor integrated circuit.

8. The electronic device according to claim 7, wherein
   the calibration circuit comprises:
   a comparator configured to compare the reference clock signal and the clock signal; and
   a code generator configured to generate the code based on a comparison result of the comparator.

9. The electronic device according to claim 8, wherein
   the comparator comprises:
   a first circuit configured to generate a timing signal relating to a period according to the number of pulses of the reference clock signal; and
   a second circuit configured to count the number of pulses of the clock signal based on the generated timing signal, wherein
   the second circuit is configured to supply the comparison result based on the counted number of pulses to the code generator.

10. The electronic device according to claim 7, further comprising
    a temperature sensor, wherein
    the calibration circuit is configured to generate the code based on a detection result of the temperature sensor.

11. The electronic device according to claim 7, further comprising
    a temperature sensor; and
    a correction circuit configured to correct the code based on a detection result of the temperature sensor.

12. The electronic device according to claim 7, wherein
    the calibration circuit is configured to supply any one of a plurality of the codes corresponding to a plurality of frequency candidates of the reference clock to the voltage-controlled oscillation circuit.

13. A method of detecting frequency using a voltage-controlled oscillation circuit configured to generate a clock signal based on a code corresponding to a frequency of a received reference clock signal and on a control voltage, the method comprising:
    generating the code based on the frequency of the reference clock signal and on a frequency of the clock signal, and supplying the generated code to the voltage-controlled oscillation circuit;

generating the control voltage based on a phase difference of the clock signal with respect to the reference clock signal;

supplying the generated control voltage to the voltage-controlled oscillation circuit; and changing the frequency of the clock signal based on the supplied code and on the supplied control voltage.

14. The method according to claim 13, further comprising:

comparing the reference clock signal and the clock signal; and generating the code based on a result of the comparison.

15. The method according to claim 14, further comprising:

generating a timing signal relating to a period according to the number of pulses of the reference clock signal;

counting the number of pulses of the clock signal based on the generated timing signal; and generating the code based on the result of the comparison based on the counted number of pulses.

16. The method according to claim 13, further comprising:

measuring temperature by a temperature sensor; and generating the code based on a detection result of the temperature.

17. The method according to claim 13, further comprising:

measuring temperature by a temperature sensor; and correcting the code based on a detection result of the temperature.

18. The method according to claim 13, further comprising supplying any one of a plurality of the codes corresponding to a plurality of frequency candidates of the reference clock to the voltage-controlled oscillation circuit.

* * * * *